United States Patent
Lee et al.

(10) Patent No.: US 7,545,677 B2
(45) Date of Patent: Jun. 9, 2009

(54) NONVOLATILE MEMORY DEVICE AND METHODS OF PROGRAMMING AND READING THE SAME

(75) Inventors: Seung-Jae Lee, Hwaseong-si (KR); Dong-Hyuk Chae, Seoul (KR); Dong-Ku Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/136,150

(22) Filed: Jun. 10, 2008

(65) Prior Publication Data

US 2008/0310234 A1    Dec. 18, 2008

(30) Foreign Application Priority Data

Jun. 14, 2007  (KR) .................. 10-2007-0058414

(51) Int. Cl.
*G11C 16/04* (2006.01)
(52) U.S. Cl. .................. 365/185.18; 365/185.19; 365/185.09
(58) Field of Classification Search ............ 365/185.18, 365/185.19, 185.09
See application file for complete search history.

(56) References Cited

U.S. PATENT DOCUMENTS 7,230,852 B2 *  6/2007  Mitani et al. ........... 365/185.18

FOREIGN PATENT DOCUMENTS

| JP | 09-306182 | 11/1997 |
| JP | 2006-114078 | 4/2006 |
| KR | 10-1997-0016941 | 4/1997 |
| KR | 1020060108230 A | 10/2006 |
| KR | 100683858 B1 | 2/2007 |
| KR | 100732631 B1 | 6/2007 |

* cited by examiner

Primary Examiner—Huan Hoang
(74) Attorney, Agent, or Firm—Volentine & Whitt, P.L.L.C.

(57) ABSTRACT

A read method of a non-volatile memory device includes reading an initial threshold voltage value of an index cell from threshold voltage information cells that store information indicating the initial threshold voltage, determining a current threshold voltage value from the index cell, and comparing the initial threshold voltage value and the current threshold voltage value to calculate a shifted threshold voltage level of the index cell. A read voltage is changed by the shifted threshold voltage level to read user data using the changed read voltage.

22 Claims, 10 Drawing Sheets

Fig. 4

| Vth Inform Data | | | | | Vthini |
|---|---|---|---|---|---|
| 0 | 0 | 0 | 0 | → | 2.7V |
| 0 | 0 | 0 | 1 | → | 2.8V |
| 0 | 0 | 1 | 0 | → | 2.9V |
| 0 | 0 | 1 | 1 | → | 3.0V |
| 0 | 1 | 0 | 0 | → | 3.1V |
| 0 | 1 | 0 | 1 | → | 3.2V |
| | | ⋮ | | | ⋮ |
| 1 | 1 | 1 | 1 | → | 4.2V |

NONVOLATILE MEMORY DEVICE AND METHODS OF PROGRAMMING AND READING THE SAME

CROSS-REFERENCE TO RELATED APPLICATION

A claim of priority is made to Korean Patent Application No. 10-2007-0058414, filed on Jun. 14, 2007, the subject matter of which is hereby incorporated by reference.

BACKGROUND

The present invention relates to a non-volatile memory device, and more particularly, the present invention relates to programming and reading a non-volatile memory device.

In non-volatile memory devices, data is retained even when power is removed. Examples of non-volatile memory devices include mask read-only memory (ROM) (MROM), electrically erasable programmable ROM (EEPROM), and the like.

A flash memory device, in particular, may have a different configuration and operation than a conventional EEPROM. The concept of a flash memory device was introduced as a flash EEPROM in 1984 by Toshiba. A flash memory device may perform an electric erase operation by block, sector or chip units. Further, the flash memory device may be configured to perform a program operation by one bit units. The flash memory device may have architecture similar to a disk-type auxiliary storage device having a storage area divided and formatted in sector units.

A flash memory device may be classified as a NOR-type flash memory device or a NAND-type flash memory device. In the NOR-type flash memory device, memory cells are connected in parallel between a bit line and a ground line. In the NAND-type flash memory device, memory cells are connected in series between a bit line and a ground line. The NOR-type flash memory device has various advantages, including a simple peripheral circuit and a short read access time. However, since the NOR-type flash memory device requires contact with a bit line per cell, it typically needs a larger cell area than the NAND-type flash memory device. In comparison, since memory cells of the NAND-type flash memory device are connected in series to a bit line, a read speed of the NAND-type flash memory device may be relatively slow as compared to the NOR-type flash memory device.

Threshold voltages of programmed memory cells in a flash memory device may change or shift due for various reasons, such as incremental step pulse programming (ISPP) increments, floating gate coupling, charge loss and the like. This may deteriorate reliability during read operations.

SUMMARY OF THE INVENTION

Embodiments of the present invention are directed to non-volatile memory devices, memory systems including the same, and methods of programming and reading the same. Accordingly, reliability of read operations may be improved, regardless of changes to threshold voltages.

One aspect of the present invention provides a read method of a non-volatile memory device which includes reading an initial threshold voltage value of an index cell from threshold voltage information cells that store information indicating the initial threshold voltage, determining a current threshold voltage value from the index cell, and comparing the initial threshold voltage value and the current threshold voltage value to calculate a shifted threshold voltage level of the index cell. A read voltage is changed by the shifted threshold voltage level to read user data using the changed read voltage.

Another aspect of the present invention provides a program method of a non-volatile memory device which includes programming user data, programming an index cell with an index bit for monitoring a threshold voltage variation, reading an initial threshold voltage of the index cell, and programming data corresponding to the initial threshold voltage in threshold voltage information cells. The index cell and the threshold voltage information cells are connected to a first word line.

Still another aspect of the present invention provides a non-volatile memory device which includes a memory cell array, a row decoder, a word line voltage generator, a page buffer and a controller. The memory cell array includes a main area and an index area. The main area has main memory cells arranged among multiple word lines and multiple bit lines for storing user data bits. The index area has index memory cells arranged among the multiple word lines and multiple index bit lines, and include threshold voltage information cells and an index cell storing an index bit and providing a threshold voltage variation. The row decoder selects one of the word lines in response to an address. The word line voltage generator supplies a word line voltage to the selected word line in response to a step code. The page buffer temporarily stores the user data bits to be programmed in or sensed from the main area, temporarily stores the index bit to be programmed in the index area and data bits corresponding to an initial threshold voltage of the index cell, and temporarily stores the index bit and the data bits corresponding to the initial threshold voltage sensed from the index area via the multiple index bit lines. The controller controls the word line voltage generator and the page buffer, and generates the step code applied to the word line voltage generator.

BRIEF DESCRIPTION OF THE FIGURES

Non-limiting and non-exhaustive embodiments of the present invention will be described with reference to the attached drawings, in which like reference numerals refer to like parts throughout the figures, unless otherwise specified. In the figures:

FIG. 4 is a diagram showing data values stored in threshold voltage information cells and threshold voltage values corresponding to the data values, according to an exemplary embodiment of the present invention;

DETAILED DESCRIPTION OF THE EMBODIMENTS

Figure 1:
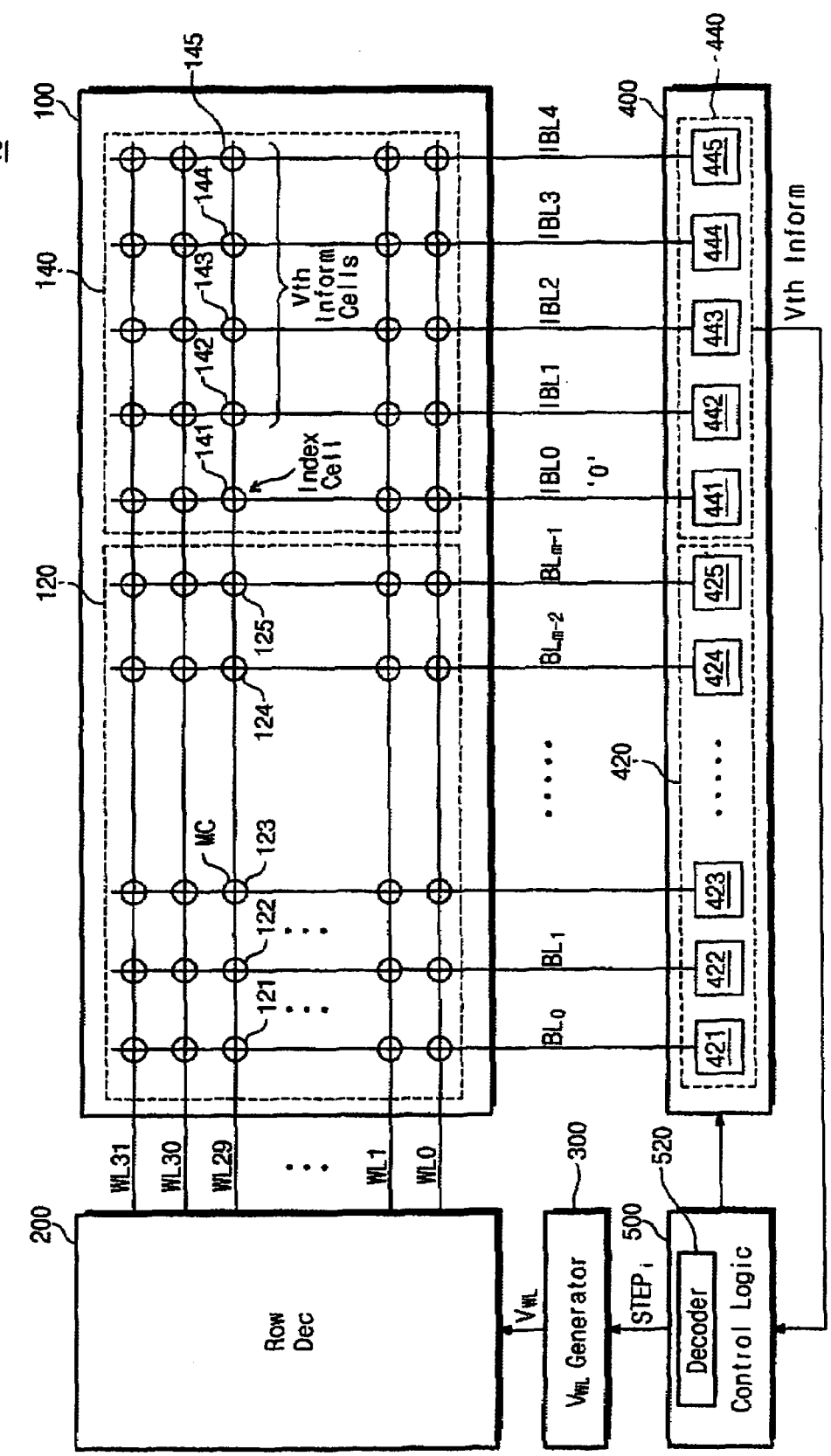
FIG. 1 is a block diagram showing a non-volatile memory device, according to an exemplary embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements and techniques are not described with respect to some of the embodiments of the present invention. Throughout the drawings and written description, like reference numerals will be used to refer to like or similar elements.

A non-volatile memory device, according to various exemplary embodiments of the present invention, includes an index area configured to capture a shift or change in threshold voltage. The index area may include index cells for storing index bits and threshold voltage information cells for storing initial threshold voltages of the index cells. During a read operation, the non-volatile memory device may be configured to detect a difference between an initial threshold voltage stored in threshold voltage information cells and a current threshold voltage of an index cell, and to reflect the detection result in the read operation. This improves reliability of the read operation, even though threshold voltages of programmed memory cells are changed.

FIG. 1 is a block diagram showing a non-volatile memory device, according to an exemplary embodiment of the present invention. The non-volatile memory device illustrated in FIG. 1 may be a flash memory device, for example. However, it is understood that the various embodiments may be applied to other types of memory devices, such as mask MROM, programmable ROM (PROM), ferroelectric random access memory (RAM) (FRAM), phase-change RAM (PRAM), and the like.

Referring to FIG. 1, a non-volatile memory device 10 includes a memory cell array 100, a row decoder 200, a word line voltage generator 300, a page buffer 400 and a controller or control logic 500. The non-volatile memory device 10 is be configured to capture a shifted or changed level of a threshold voltage, using an initial threshold voltage of an index cell stored in an index area 140, and to reflect the captured result in a read operation.

The memory cell array 100 includes a main area 120 for storing user data and the index area 140 for informing threshold voltage changes. As illustrated in FIG. 1, memory cells in the main area 120 and memory cells in the index area 140 are connected in common to respective word lines. For example, memory cells 121~125 in the main area 120 and memory cells 141~145 in the index area 140 are connected in common to a word line WL29. Memory cells in the index area 140 may be divided into index cell 141 for storing an index bit and threshold voltage (Vth) information cells 142~145 for storing data corresponding to an initial threshold voltage value of the programmed index cell 141.

The main area 120 includes memory cells, such as memory cells 121~125, arranged at intersections of word lines WL0~WL31 and bit lines BL0~BLm-1. The main area 120 may include multiple blocks (not shown in FIG. 1), each of which has multiple cell strings connected to corresponding bit lines. Each of the cell strings may consist of a string select transistor connected to a corresponding bit line, a ground select transistor connected to a common source line, and memory cells connected in series between the select transistors (not shown in FIG. 1).

The index area 140 includes memory cells, such as memory cells 141~145, arranged at intersections of the word lines WL0~WL31 and index bit lines IBL0~IBL4. In particular, the memory cells connected to the index bit line IBL0 (e.g., memory cell 141) are memory cells in which index bits are programmed. In FIG. 1, one index cell is shown connected to one word line, although it is understood that the present invention is not limited to the depicted arrangement. For example, two or more index cells may be connected to each of word lines in order to increase representation of index cells.

The memory cells connected to the index bit lines IBL1~IBL4 (e.g., memory cells 142~145) are threshold voltage information cells in which data values corresponding to initial threshold voltage values of index cells are programmed, respectively. This will be more fully described below, with respect to FIG. 3.

The row decoder 200 decodes a row address from an address buffer (not shown), and selects a word line according to the decoded result. The row decoder 200 may supply a word line voltage $V_{WL}$ to the selected word line according to a mode of operation.

The word line voltage generator 300 generates the word line voltage $V_{WL}$ in response to a step code STEPi from the control logic 500. A voltage level of the word line voltage $V_{WL}$ may be determined according to the step code STEPi. The word line voltage $V_{WL}$ may include a program voltage, a read voltage, an erase voltage, and the like. A voltage level of the read voltage, in particular, may be varied according to changes in a level of a threshold voltage. For example, when a threshold voltage of an index cell is determined to have shifted lower by 0.2V, the control logic 500 may control the word line voltage generator 300 to generate a read voltage that is lower than the read voltage of a normal read operation by 0.2V. This will be more fully described below, with respect to FIGS. 2 and 3.

The page buffer 400 is configured to sense data from the memory cell array 100 and/or to temporarily store data to be programmed in the memory cell array 100. The page buffer 400 may thus be controlled by the control logic 500 to operate as a sense amplifier or a write driver, according to a mode of operation. The page buffer 400 includes multiple latches 421~425 and 441~445. In general, during a program operation, respective memory cells may be determined to be program cells or program-inhibit cells based on data stored in corresponding latches. For example, when data "0" is stored in a latch, the memory cell corresponding to the latch may be programmed. When data "1" is stored in a latch, the memory cell corresponding to the latch may be program inhibited.

The main page buffer 420 includes latches 421~425, which are respectively connected to bit lines BL0~BLm-1, for example. The latches 421~425 may be configured to sense data bits via the bit lines BL0~BLm-1 and to temporarily store data bits to be programmed. Data sensed during a read operation may be externally output via a data input/output circuit (not shown). Data sensed during a verify operation may be output to a pass/fail check circuit (not shown).

The index page buffer 440 includes latches 441~445, which are respectively connected to bit lines IBL0~IBL4, for example. In the depicted embodiment, the latch 441 stores index bit data temporarily. For example, during a program operation, data "0" may be stored in the latch 441 under control of the control logic 500 in order to program an index bit to index cell 141. After the index bit is programmed in the index cell 141, data "1" may be stored in the latch 441 under control of the control logic 500 in order to measure an initial threshold voltage value of the index cell 141.

Data related to the initial threshold voltage of the index cell 141 may be temporarily stored in the latches 442~445, which are respectively connected to threshold voltage information cells 142~145. For example, in order to program data bits "0", "1", "0" and "1" in the threshold voltage information cells 142~145, respectively, data bits "0", "1", "0" and "1" may be temporarily stored in the latches 442~445 under control of the control logic 500. Subsequently, during a read operation, data bits "0", "1", "0" and "1" read from the threshold voltage information cells 142~145 may be stored in the latches 442~445 and transferred to the control logic 500.

The control logic 500 controls overall operation of the flash memory device 10 for program/erase/read operations. The control logic 500 may control the word line voltage generator 300 and the page buffer 400 according to input commands and addresses to perform the program/erase/read operations.

During a program operation, the control logic 500 may control the word line voltage generator 300 and the page buffer 400 in response to a program command to program user data in the main area 120 and an index bit in the index cell 141 of the index area 140. This will be more fully described with reference to FIG. 2.

During a read operation, the control logic 500 may control the word line voltage generator 300 and the page buffer 400 in response to a read command to read data of an initial threshold voltage value from the threshold voltage information cells 142~145 of the index area 140. Meanwhile, in order to capture a current threshold voltage value of the index cell 141, the control logic 500 may control the word line voltage generator 300 and the page buffer 400 in response to a read command to perform a read operation with a word line voltage $V_{WL}$ being increased by a given level. This will be more fully described with reference to FIG. 3.

The control logic 500 is configured to detect a threshold voltage difference between an initial threshold voltage value and a current threshold voltage value of the index cell 141, and to reflect the detected threshold voltage difference when reading data from the main area 120. That is, during a read operation, a level of word line voltage $V_{WL}$ of a selected word line may be changed by a shifted threshold voltage level. The control logic 500 may include a decoder 520 that generates the step code STEPi during program/erase/read operations. The decoder 520 may be configured to operate differently when the control logic 500 controls the main page buffer 420 and when the control logic 500 controls the index page buffer 440.

When the control logic 500 controls the main page buffer 420, during a program/verify operation, the decoder 520 operates as follows. The control logic 500 determines whether data bits sent from the main page buffer 420 via a pass/fail check circuit (not shown) are pass data bits. If not, the control logic 500 increases a program loop count value. The decoder 520 generates a step code STEPi corresponding to the increased program loop count value and transfers the step code STEPi to the word line voltage generator 300. As the program loop count value is increased, the step STEPi is also increased stepwise. This means that the word line voltage $V_{WL}$ is increased.

Assuming that the control logic 500 controls the index page buffer 400, the decoder 520 operates as follows in order to read a threshold voltage of the index cell 141 that stores an index bit. The control logic 500 determines whether data from the latch 441 of the index page buffer 440 is "0". If not, the control logic 500 increases a step count value, and the decoder 520 generates a step code STEPi corresponding to the increased step count value and sends it to the word line voltage generator 300. If so, the decoder 520 stores data corresponding to the step count value in latches 442~445 of the index page buffer 440.

The non-volatile memory device 10, according to the present embodiment, may determine whether a threshold voltage of an index cell 141 is changed, adjust a read voltage by the changed threshold voltage during a read operation, and perform a read operation using the adjusted read voltage. Accordingly, it is possible to reduce read errors, even though threshold voltages of the memory cells have shifted. Threshold voltage changes may have various causes, such as charge loss, coupling effect and the like. How read error is decreased will be more fully described with reference to FIG. 10.

Figure 2:
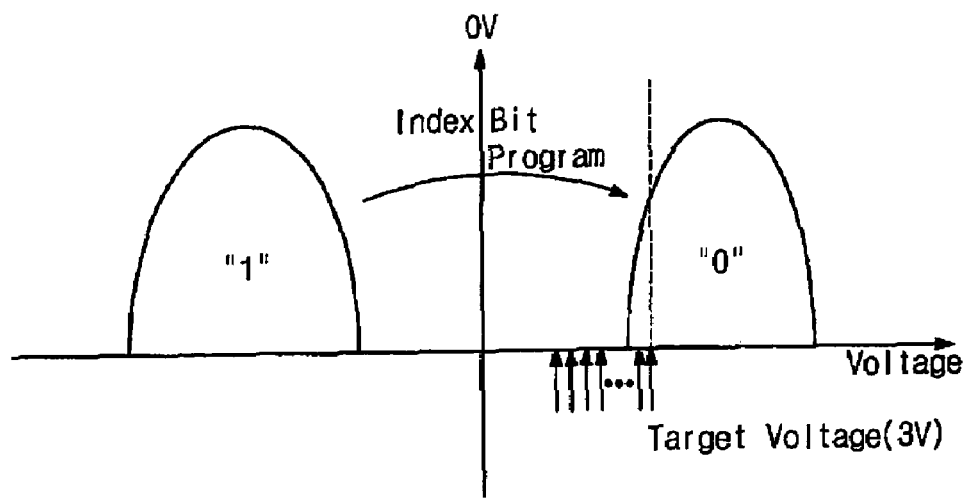
FIG. 2 is a diagram showing an operation of programming an index bit in an index cell, according to an exemplary embodiment of the present invention.

FIG. 2 is a diagram showing an operation of programming an index bit in an index cell, according to an exemplary embodiment of the present invention.

The control logic 500 controls the word line voltage generator 300 and the page buffer 400 to program the index bit in index cell 141. More particularly, referring to FIGS. 1 and 2, the control logic 500 controls the word line voltage generator 300 and the page buffer 400 to supply a word line voltage having an initial level to a word line connected to the index cell 141 and to store data "0" in the latch 441 connected to the index bit line IBL0. The control logic 500 also controls the word line voltage generator 300 to increase the word line voltage $V_{WL}$ by a given level or increment (e.g., 0.1V). After a program voltage is supplied, the control logic 500 performs a verify operation using a target voltage level (e.g., 3V). If a threshold voltage of an index cell 141 is greater than the target voltage level, the program operation is ended with respect to the index cell 141. When the program operation for index cell 141 is ended, data "1" is stored in the latch 441, corresponding to the index cell 141, under the control of the control logic 500.

Figure 3:
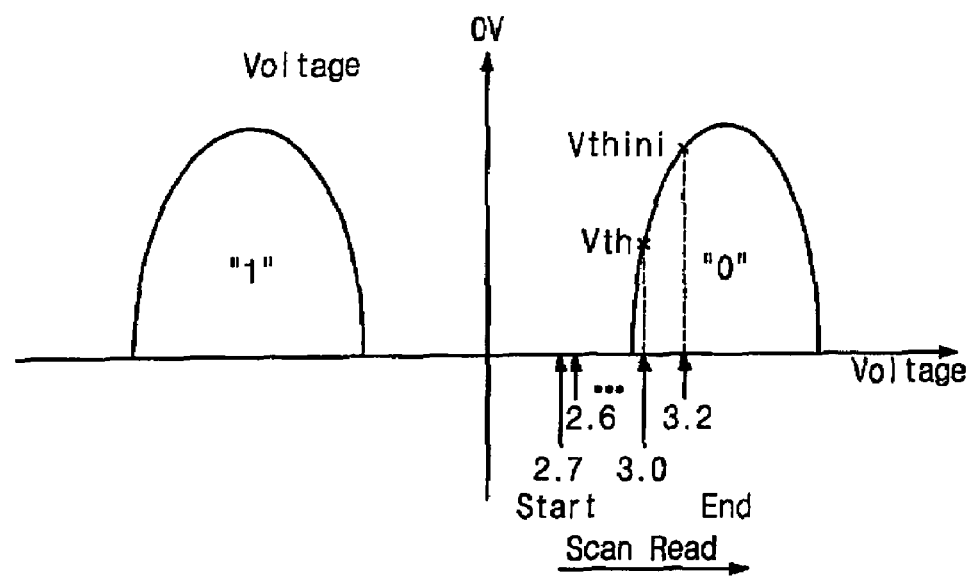
FIG. 3 is a diagram showing an operation of reading a threshold voltage value of an index cell, according to an exemplary embodiment of the present invention.

FIG. 3 is a diagram showing an operation of reading a threshold voltage value of an index cell, according to an exemplary embodiment of the present invention.

An operation of reading an initial threshold voltage Vthini will be more fully described below. For convenience of description, it is assumed that, when an index bit is programmed in an index cell 141, the initial threshold voltage Vthini of the index cell 141 is 3.2V, for example. It is further assumed that a read voltage is stepwise increased by 0.1V from 2.7V. Referring to FIG. 3, the threshold voltage of the index cell 141 may be read with the read voltage being incrementally increased by 0.1V from 2.7V.

In particular, control logic 500 controls the word line voltage generator 300 and the page buffer 400 to supply the word line voltage $V_{WL}$ having an initial level (e.g., 2.7V) to a word line connected to the index cell 141 and to sense data stored in the index cell 141 via the index bit line IBL0. After the read operation ends, using the word line voltage $V_{WL}$ having the initial level, the control logic 500 determines whether data in the latch 441 corresponding to the index cell 141 is "0", via a verify operation.

If the data in the latch 441 is determined to be "0", an initial threshold voltage of the index cell 141 is 2.7V. If the data in the latch 441 is determined to be "1", the control logic 500 controls the word line voltage generator 300 to supply a word line connected to the index cell 141 with a word line voltage $V_{WL}$ of 2.8V, which has been increased by 0.1V. At this time, the control logic 500 controls the page buffer 400 to sense data stored in the index cell 141 via the index bit line IBL0. After the read operation is performed using the word line voltage $V_{WL}$ at the increased level, the control logic 500 determines whether data sensed by the latch 441 associated with the index cell 141 is "0", via another verify operation.

If the data in the latch 441 is determined to be "0", an initial threshold voltage of the index cell 141 is 2.8V. If the data in the latch 141 is determined to be "1", the control logic 500 controls the word line voltage generator 300 to supply a word line connected to the index cell 141 with a word line voltage $V_{WL}$ of 2.9V, which has again been increased by 0.1V. At this time, the control logic 500 controls the page buffer 400 to sense data from the index cell 141 via the index bit line IBL0. After the read operation is ended using the word line voltage $V_{WL}$ having the increased level, the control logic 500 determines whether data sensed from the index cell 141 by the latch 441 is "0", via another verify operation.

The above-described procedure is repeated until the level of the word line voltage $V_{WL}$ reaches the initial threshold voltage Vthini. Once the level of the word line reaches the initial threshold voltage Vthini, e.g., 3.2V, data "0" is stored in the latch 441 of the index page buffer 440. Accordingly, the control logic 500 confirms data "0" is stored in the latch 441 and ends the operation of reading the threshold voltage of the index cell 141.

An operation of reading an initial threshold voltage may be performed in the above-described manner. However, an operation of reading a changed threshold voltage may be performed as follows.

In the non-volatile memory device 10, the voltage level of the word line $V_{WL}$ may be determined according to the step code STEPi transferred from the control logic 500. The decoder 520 of the control logic 500 generates a corresponding step code STEPi according to the voltage level of the word line voltage $V_{WL}$. In order to store data corresponding to an initial threshold voltage, during a read operation, the decoder 520 decodes the step code STEPi corresponding to the initial threshold voltage of the index cell 141. The control logic 500 supplies the index page buffer 440 with decoded data bits corresponding to the initial threshold voltage, which are programmed in threshold voltage information cells (e.g., cells 142~145).

FIG. 4 is a diagram showing exemplary data values stored in threshold voltage information cells and exemplary threshold voltage values corresponding to the data values. Referring to FIG. 4, the initial threshold voltage Vthini of the index cell 141 is 2.7V, for example, when data bits "0", "0", "0" and "0" are stored in threshold voltage information cells 142~145, respectively. Likewise, when the initial threshold voltage Vthini of the index cell 141 is 3.2V, for example, as illustrated in FIG. 2, data bits "0", "1", "0" and "1" are programmed in the threshold voltage information cells 142~145, respectively.

Figure 5:
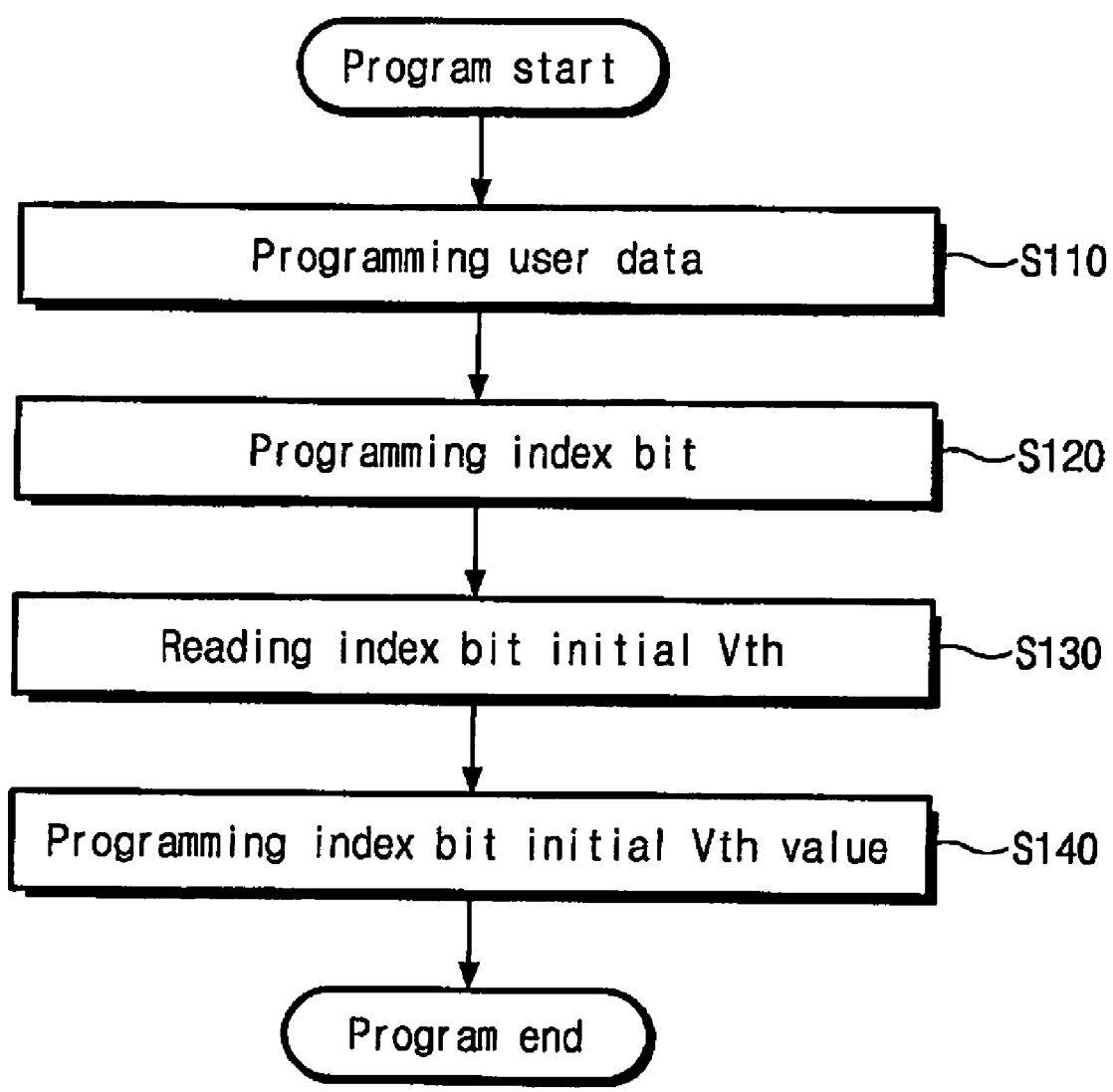
FIG. 5 is a flow chart showing a program method of a non-volatile memory device, according to an exemplary embodiment of the present invention.

FIG. 5 is a flow chart showing a method of programming a non-volatile memory device, according to an exemplary embodiment of the present invention. The program method will be more fully described with reference to FIGS. 1 and 5.

In step S110, user data is programmed, for example, in the main area 120. More particularly, when the non-volatile memory device 10 receives a program command, an address and user data, the user data may be transferred to the main page buffer 420 of the page buffer 400 via an input/output buffer (not shown) under control of the control logic 500. At this time, the control logic 500 controls the word line voltage generator 300 to supply a program voltage to a word line selected according to the input address.

In step S120, an index bit is programmed in an index cell (e.g., index cell 141), which is connected to the selected word line. The control logic 500 controls the word line voltage generator 300 so that the program voltage is supplied to the selected word line. The control logic 500 performs a program operation with the program voltage being increased incrementally, as discussed above. At this time, the program operation ends when data sensed on the basis of a verify voltage is "0". The verify voltage may be a target voltage. That is, during a program operation of the index cell 141, if the threshold voltage is over the target voltage, the program operation is completed. Meanwhile, the control logic 500 controls an index page buffer 440 so that a program voltage is supplied to the index bit line IBL0 connected to the index cell 141. This program operation may be substantially same as that described with respect to FIG. 2, and therefore the description will not be repeated.

In step S130, a read operation is performed to determine the initial threshold voltage Vth of the index cell 141. In order to determine the initial threshold voltage, the control logic 500 performs the read operation using a voltage level of a read voltage, which is incrementally increased. This read operation may be substantially the same as that described with respect to FIG. 3, and therefore the description will not be repeated.

Data corresponding to the initial threshold voltage of the index cell 141 is programmed in threshold voltage information cells 142~145 in step S140. The control logic 500 captures the initial threshold voltage of the index cell 141 and decodes the initial threshold voltage into corresponding data, which is programmed in the threshold voltage information cells 142~145. The decoding operation may be substantially the same as that described with respect to FIG. 4, and therefore the description will not be repeated.

The non-volatile memory device 10, according to the present embodiment, may be configured to program user data together with data corresponding to the initial threshold voltage of the index cell 141, during a program operation. The initial threshold voltage of the programmed index cell 141 is used as an index for capturing threshold voltage change.

Figure 6:
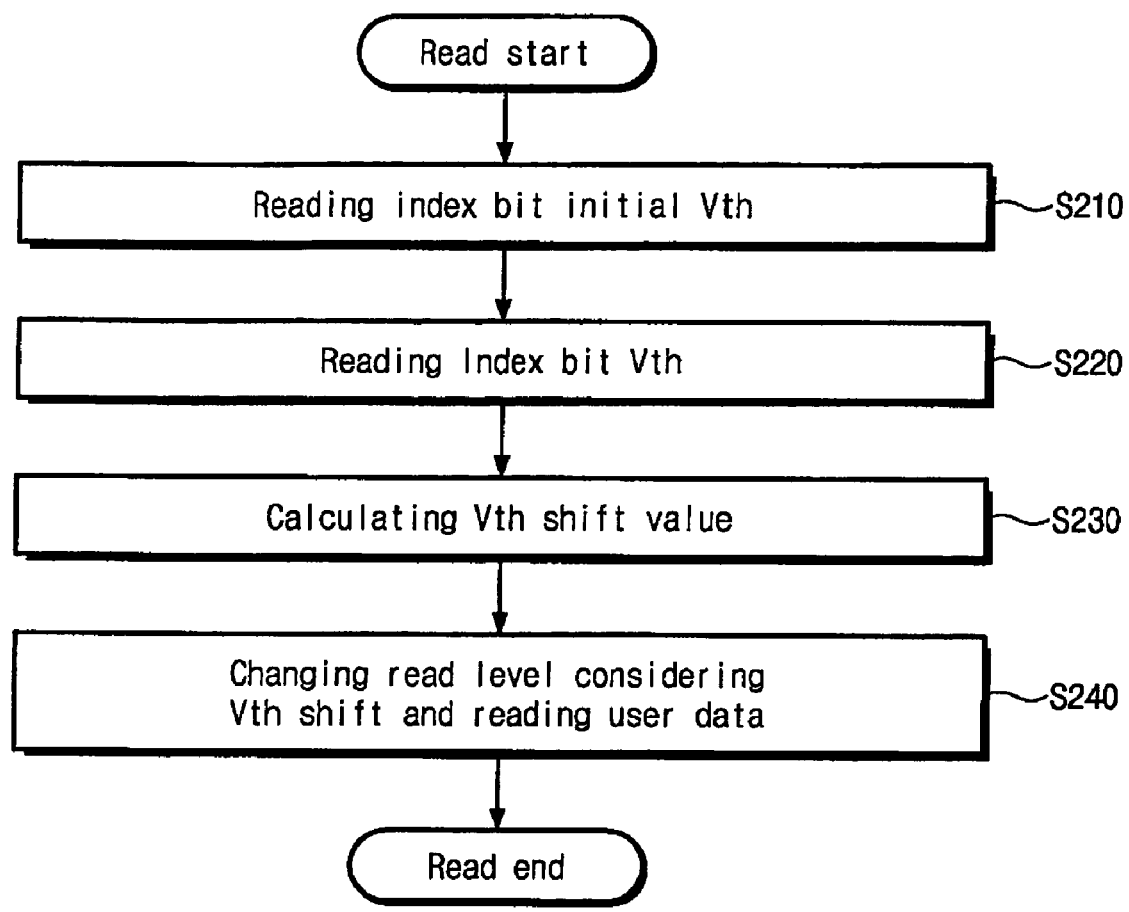
FIG. 6 is a flow chart showing a read method of a non-volatile memory device, according to an exemplary embodiment of the present invention.

FIG. 6 is a flow chart showing a method of reading a non-volatile memory device, according to an exemplary embodiment of the present invention. The read method will be more fully described below with reference to FIGS. 1 and 6.

In step S210 of FIG. 6, when a read command and an address are received, the control logic 500 controls the word line voltage generator 300 and the index page buffer 440 to read data indicating the initial threshold voltage of the index cell 141 from threshold voltage information cells 142~145 connected to a selected word line. In particular, the word line voltage generator 300 generates a read voltage to be supplied to a selected word line in response to a step code STEPi. As described above, the step code STEPi may be from the decoder 520 of the control logic 500. Meanwhile, the index page buffer 440 senses data bits from threshold voltage information cells 142~145 via corresponding index bit lines IBL1~IBL4, and the sensed data bits are stored in latches 442~445, respectively. The control logic 500 fetches data bits from the latches 442~445 and detects the initial threshold voltage value.

In step S220, a read operation is performed to detect a current threshold voltage of the index cell 141. For example, the control logic 500 controls the word line voltage generator 300 and the index page buffer 440 to detect the threshold voltage of the index cell 141, where a word line voltage $V_{WL}$ is incrementally increased by 0.1V from 2.7V. This read operation is substantially the same as that described in FIG. 3, and therefore the description will not be repeated.

In step S230, the control logic 500 compares a current threshold voltage and the initial threshold voltage of the index cell 141 to calculate a changed or shifted level of the threshold voltage, which may be referred to as a shift value.

In step S240, the control logic 500 controls the word line voltage generator 300 and the page buffer 400 to vary a read voltage by the shifted level and to read user data using the varied read voltage.

The non-volatile memory device 10 may perform the read operation referring to the changed level of the threshold voltage of the index cell. This makes it possible to reduce errors caused by changes of threshold voltages during a read operation.

As illustrated in FIG. 1, an index area is arranged per word line. That is, index and threshold voltage information cells are connected to word lines. However, it is understood that the present invention is not limited to the index area structure of the embodiment depicted in FIG. 1.

Figure 7:
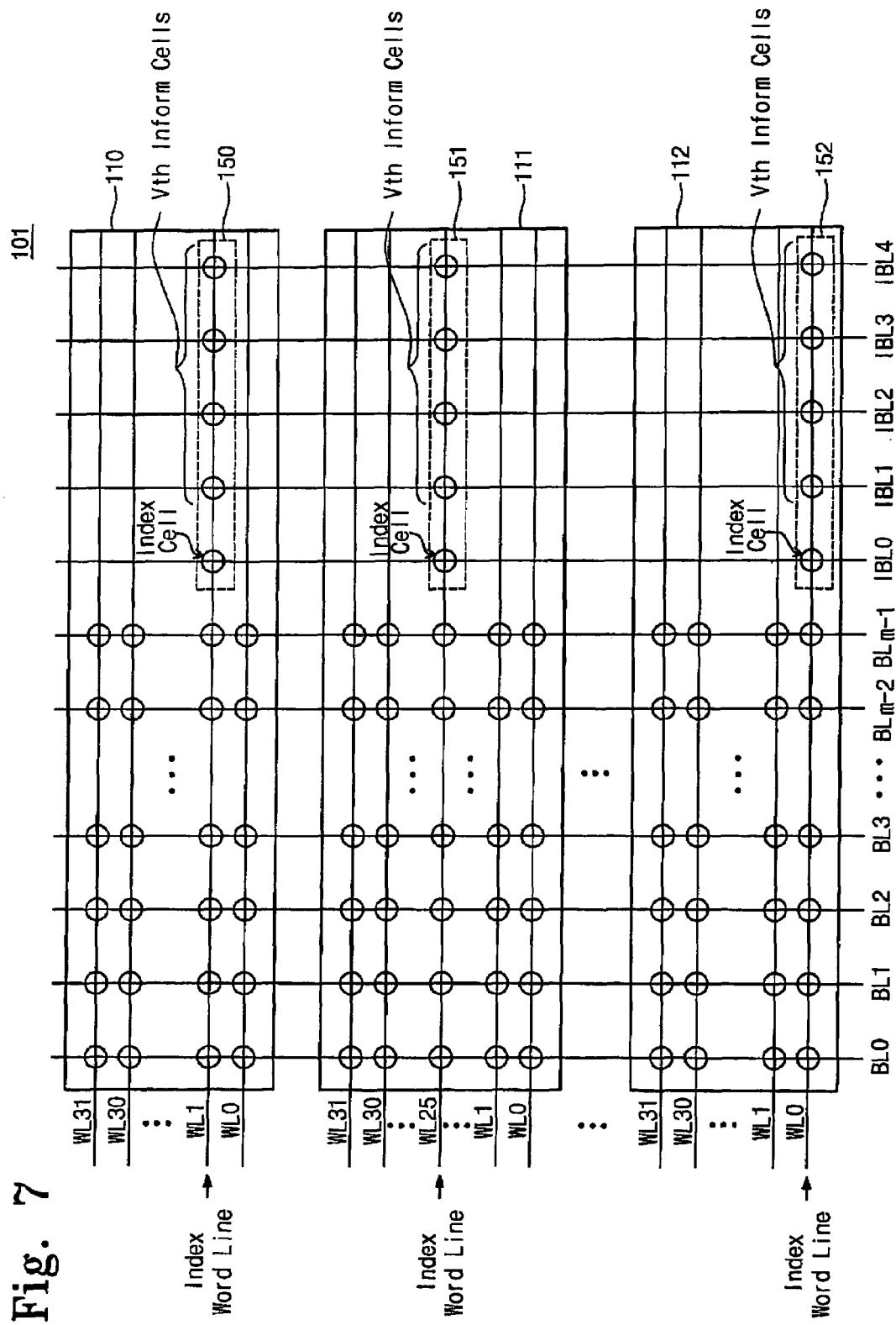
FIG. 7 is a diagram showing a memory cell array, according to another exemplary embodiment of the present invention.

FIG. 7 is a block diagram showing a memory cell array, according to another exemplary embodiment of the present invention.

Referring to FIG. 7, a memory cell array 101 may include memory blocks 110~112, each of which includes an index word line having an index area. For example, memory block 110 has word line WL1 as the index word line, memory block 111 has word line WL25 as the index word line, and memory block 112 has word line WL0 as the index word line. The control logic 500 may be configured to store information with respect to index word lines corresponding to the respective memory blocks. During a program or read operation, the control logic 500 may be configured to initially access the respective index word lines, and to store or read data related to an initial threshold voltage.

The index word line in each of the memory blocks (e.g., 110~112) may be changed, so that the corresponding an index cell is representative of the memory cells. For example, when performing a wear leveling operation with respect to a memory block, a word line indicating average wear of the memory block may be selected as the index word line. Information for a newly selected index word line may be stored in the control logic 500.

The index cell is representative because it has the same program/erase count value as memory cells in the main area, represented by the index cell. In general, an erase operation is performed by memory block unit. The erase operation may be performed with respect to pages of a memory block that are not programmed. In this case, it is difficult to consider an index representative of an average program/erase count value of the memory block. Accordingly, in order to increase the representation of the index cell, the non-volatile memory device according to an embodiment may determine whether a memory block to be erased includes pages which are not programmed. If so, these pages are programmed, and then an erase operation is carried out. As a result, all pages in the memory block may have the same program/erase count value. That is, index cells in the index area and memory cells in the main area may suffer from the same endurance.

The non-volatile memory device 10 illustrated in FIG. 1 may be configured to program an initial threshold voltage value of an index cell during a program operation, to capture a changed level of a threshold voltage of the index cell by use of the programmed initial threshold voltage value, and to reflect the changed level of a threshold voltage in a read operation. It is understood that the read operation is not limited to the above description.

Figure 8:
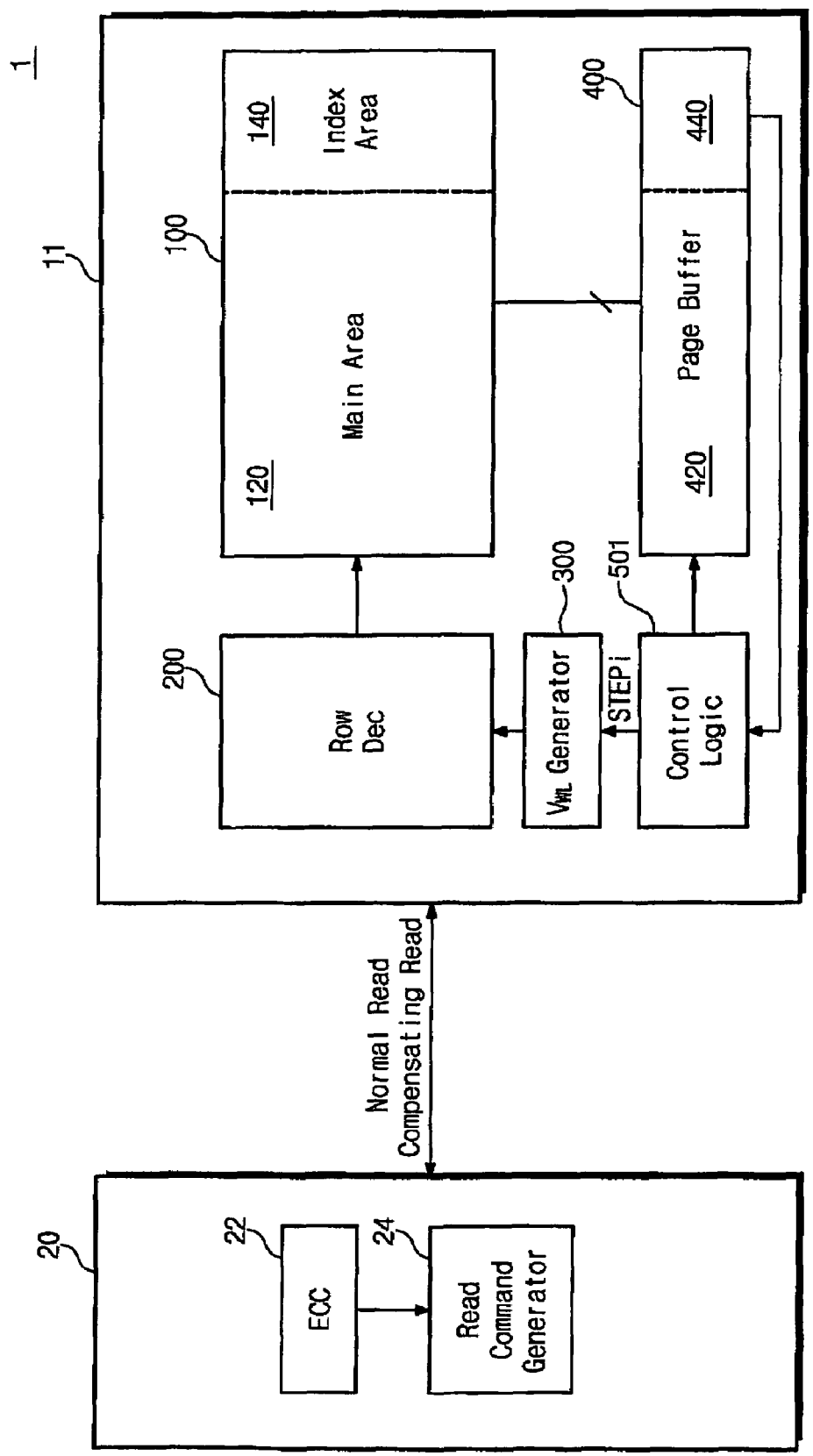
FIG. 8 is a block diagram showing a memory system, according to an exemplary embodiment of the present invention.

FIG. 8 is a block diagram showing a memory system, according to an exemplary embodiment of the present invention.

Referring to FIG. 8, a memory system 1 includes a non-volatile memory device 11 and a memory controller 20. The memory controller 20 determines whether to perform a compensating read operation where a changed threshold voltage level is reflected. If the compensating read operation is needed, the memory controller 20 may generate a compensating read command and transfer it to the non-volatile memory device 11. When an error bit number is determined to be over a given number during a normal read operation, the memory controller 20 may generate a compensating read command and transfer it to the non-volatile memory device 11.

The non-volatile memory device 11 may include a memory cell array 100, a row decoder 200, a word line voltage generator 300 and a page buffer 400, which are substantially the same to those described above with respect to FIG. 1, respectively. Further, controller or control logic 501 in FIG. 8 may operate substantially the same as the control logic 500 as described with respect to FIG. 1 during a program operation. Therefore, descriptions of these components will not be repeated.

During a read operation, the control logic 501 may operate differently, according to read commands input from the memory controller 20. For example, when a normal read command is input, the control logic 501 may control the word line voltage generator 300 and the page buffer 400 to perform a read operation without changing a read voltage. However, when a compensating read command is input, the control logic 501 may control the word line voltage generator 300 and the page buffer 400 to detect a changed or shifted level of a threshold voltage of an index cell, vary the read voltage according to the shifted threshold voltage level, and perform a read operation using the varied read voltage, as described above.

Continuing to refer to FIG. 8, the memory controller 20 may include an error detector 22 (indicated by ECC in FIG. 8), for detecting data errors during the read operation, and a read command generator 24. The error detector 22 may be configured to detect data errors during a normal read operation. When an error bit number detected by the error detector 22 is determined to be over a given number during a normal read operation, the read command generator 24 may generate a compensating read command, which is transferred to the non-volatile memory device.

The memory system 1, according to the depicted embodiment, may be configured to store data corresponding to an initial threshold voltage of an index cell during a program operation and to perform a read operation by determining whether to perform a compensating read operation, in which a changed threshold voltage level is reflected, during a read operation.

Figure 9:
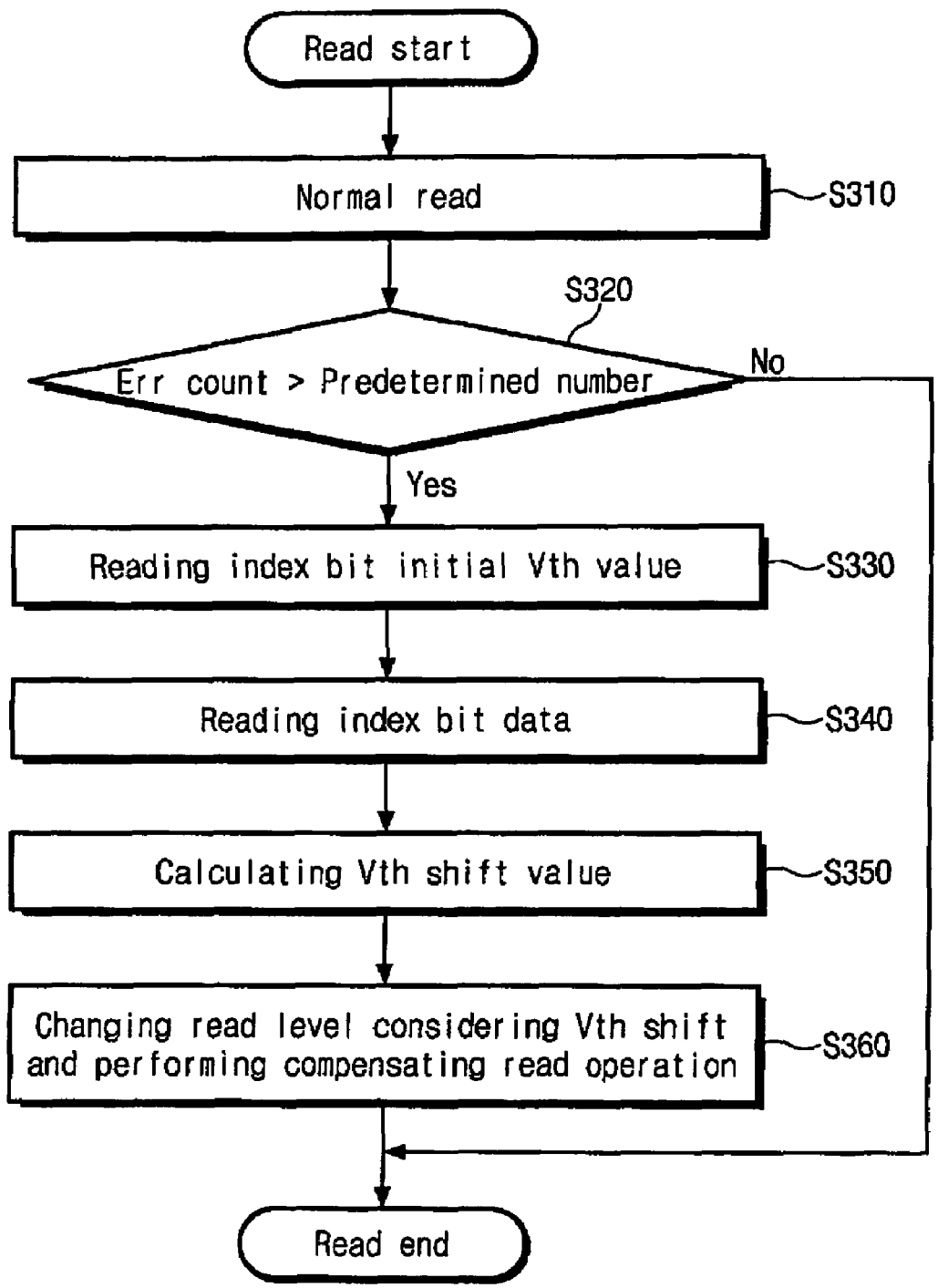
FIG. 9 is a flow chart showing a read method of a memory system illustrated in FIG. 8, according to an exemplary embodiment of the present invention.

FIG. 9 is a flow chart showing a method of reading a memory system illustrated in FIG. 8, according to an exemplary embodiment of the present invention. The read method of a memory system 1 will be more fully described with reference to FIGS. 8 and 9.

In step S310 of FIG. 9, the non-volatile memory device 11 performs a read operation in response to a normal read command. If the read command is sent to the memory controller 20 from an external host (not shown), the read command generator 24 in the memory controller 20 may generate a normal read command and provide it to the non-volatile memory device 11. The control logic 501 of the non-volatile memory device 11 controls the word line voltage generator 300 and the page buffer 400 to sense data from memory cells that are connected to a selected word line. Meanwhile, data sensed by the main page buffer 420 of the page buffer 400 is output to the memory controller 20. The error detector 22 of the memory controller 20 may detect an error from the data transferred from the non-volatile memory device 11 as a result of the read operation.

In step S320, the memory controller 20 determines whether an error bit number detected by the error detector 22 is over a given number. If the error bit number is not over the given number, the read operation may be ended. On the other hand, if the error bit number is over the given number, the procedure goes to step S330.

In step S330, the read command generator 24 of the memory controller 20 generates a compensating read command and sends it to the non-volatile memory device 11. The control logic 501 in the non-volatile memory device 11 reads data corresponding to an initial threshold voltage value of an index cell (e.g., 141) from threshold voltage information cells (e.g., 142~145) connected to a selected word line. An operation of reading data corresponding to the initial threshold voltage is substantially the same as that described with respect to FIG. 3, and therefore the description will not be repeated.

In step S340, the control logic 501 reads a current threshold voltage of the index cell 141. For example, the control logic 501 may control the word line voltage generator 300 and the index page buffer 440 to detect the threshold voltage value of the index cell 141 with a word line voltage $V_{WL}$ which is incrementally increased by 0.1V from 2.7V. This operation may be performed substantially the same as that described with respect to FIG. 3, and therefore the description will not be repeated.

In step S350, the control logic 501 compares a current threshold voltage Vth value and the initial threshold voltage value of the index cell 141 and calculates a changed or shifted threshold voltage level.

In step S360, the control logic 501 varies the read voltage by the shifted threshold voltage level, and user data may be read using the varied read voltage. Subsequently, the compensating read operation may be ended.

In accordance with the read method of the exemplary memory systems, when an error bit number is over a given number during the read operation, a compensating read operation is performed on the basis of a changed threshold voltage level.

Figure 10:
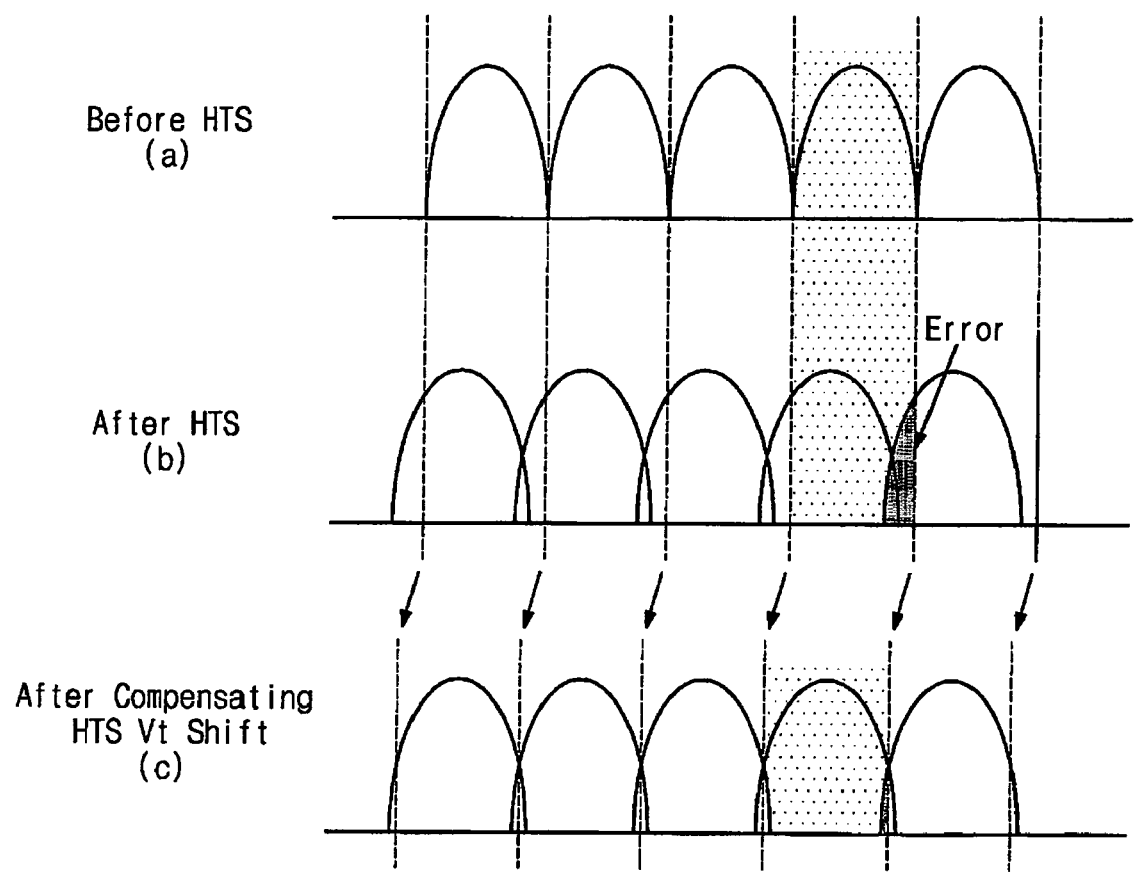
FIG. 10 is a diagram showing how errors due to threshold voltage changes are reduced by a non-volatile memory device, according to an exemplary embodiment of the present invention.

FIG. 10 is a diagram showing how errors due to threshold voltage changes are reduced by the non-volatile memory device, according to exemplary embodiments of the present invention. For convenience of description, it is assumed that threshold voltages are varied due to charge loss caused by Hot Temperature Stress (HTS), for example. In general, HTS indicates that threshold voltages of memory cells are lowered over time. That is, HTS indicates that charge in a floating gate of a programmed memory cell leaks into a substrate.

FIG. 10A shows threshold voltage distributions before HTS, and FIG. 10B shows threshold voltage distributions shifted due to HTS. As illustrated in FIG. 10B, charge stored in programmed memory cells is capable of being discharged due to HTS, which shifts threshold voltages. Error regions therefore exist as illustrated in FIG. 10B. It is understood from FIG. 10C that error is reduced during read operations by changing the read voltage, even though threshold voltages have been shifted due to HTS.

As stated above, a flash memory device is a non-volatile memory device capable of retaining stored data even when power is off. Flash memory devices are widely used for data storage and code storage, particularly in response to increased use of mobile devices, such as cellular phones, personal digital assistants (PDAs), digital cameras, portable game consoles, MP3Ps and the like. Further, flash memory devices may be used for various home applications, such as high definition television (HDTV), digital video discs or digital versatile discs (DVDs), routers, global positioning satellite (GPS) systems and the like.

Figure 11:
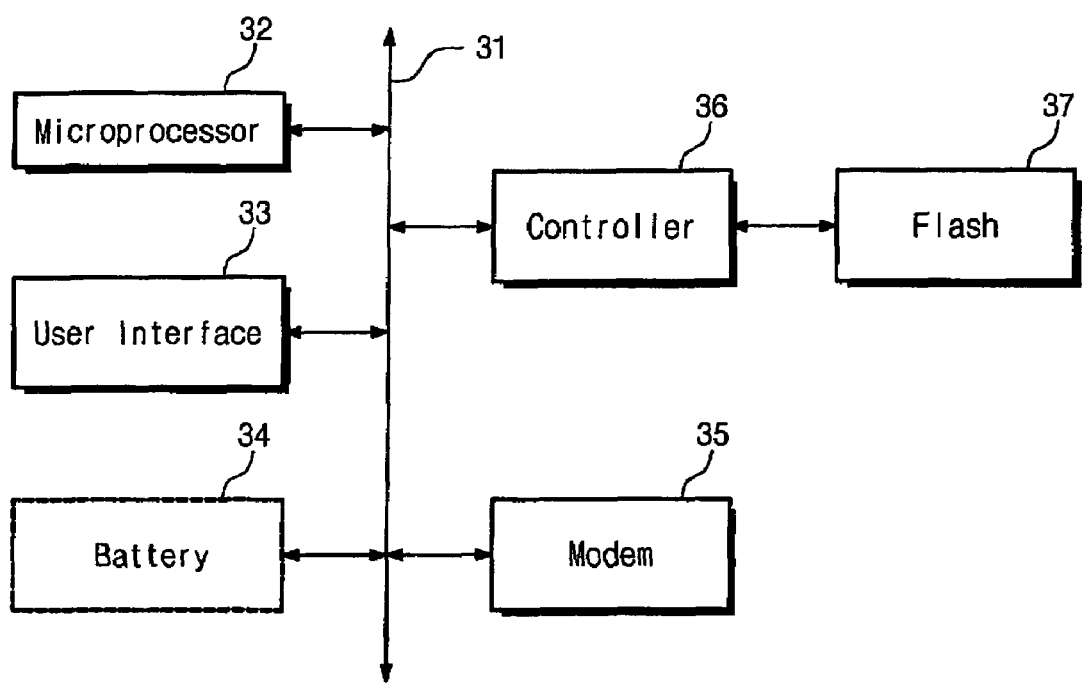
FIG. 11 is a block diagram showing a computing system including a flash memory device and a memory controller, according to an exemplary embodiment of the present invention.

FIG. 11 is a block diagram showing a computing system, including a flash memory device and a memory controller, according to an exemplary embodiment of the present invention.

A computing system 2 includes a microprocessor 32, a user interface 33, a modem 35, such as a baseband chipset, a memory controller 36 and a flash memory device 37. The flash memory device 37 may be configured substantially the same as described above with respect to FIG. 1, for example. N-bit data (where N=1 or other integer) processed/to be processed by the microprocessor 32 may be stored in the flash memory device 37 via the memory controller 36.

Where the computing system 2 is a mobile device, it may further include a battery 34, which supplies an operating voltage. Although not illustrated in the figures, it is understood that the computing system 2, according to various embodiments, may further include an application chipset, a camera image processor (CIS), mobile DRAM, and the like. The memory controller 36 and the flash memory device 37, for example, may constitute a solid state drive/disk (SSD), which uses a non-volatile memory device to store data.

It is further understood that the flash memory device and/or memory controller, according to various embodiments of the present invention, may be packaged. For example, the flash memory device and/or memory controller may be packaged using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

As set forth above, a non-volatile memory device according to various embodiments of the present invention are configured to store initial threshold voltage information of an index cell during a program operation, to capture a shifted threshold voltage level of the index cell using its threshold voltage information during a read operation, and to perform a read operation based on the shifted threshold voltage level. Accordingly, the non-volatile memory device according to the embodiments is capable of reducing read errors due to threshold voltage changes.

The above-disclosed subject matter is to be considered illustrative, and not restrictive. While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A read method of a non-volatile memory device, comprising:
   reading an initial threshold voltage value of an index cell from threshold voltage information cells that store information indicating the initial threshold voltage;
   reading a current threshold voltage value from the index cell;
   comparing the initial threshold voltage value and the current threshold voltage value to calculate a shifted threshold voltage level of the index cell; and
   changing a read voltage by the shifted threshold voltage level to read user data using the changed read voltage.

2. The read method of claim 1, wherein the non-volatile memory device comprises an index area comprising the index cell for monitoring a threshold voltage variation and the threshold voltage information cells for storing the initial threshold voltage value.

3. The read method of claim 2, wherein the index area is provided per memory block.

4. The read method of claim 2, wherein the index area is provided per page.

5. The read method of claim 4, further comprising:
   temporarily storing data to be programmed in or sensed to a memory cell array in a page buffer, the page buffer comprising an independent index page buffer corresponding to the index area.

6. The read method of claim 4, wherein the index area comprises two or more index cells per page.

7. The read method of claim 1, wherein the initial threshold voltage of the index cell is detected by sensing data of the index cell with a stepwise increased read voltage being supplied to a word line connected with the index cell.

8. The read method of claim 1, wherein the threshold voltage information cells store decoded data bits corresponding to the initial threshold voltage of the index cell.

9. The read method of claim 1, wherein the current threshold voltage of the index cell is detected by sensing data of the index cell with a stepwise increased read voltage being supplied to a word line connected with the index cell.

10. A program method of a non-volatile memory device, comprising:
    programming user data;
    programming an index cell with an index bit for monitoring a threshold voltage variation;
    reading an initial threshold voltage of the index cell; and
    programming data corresponding to the initial threshold voltage in threshold voltage information cells,
    wherein the index cell and the threshold voltage information cells are connected to a first word line.

11. The program method of claim 10, wherein the non-volatile memory device comprises a plurality of memory cells that store the user data, the plurality of memory cells being connected to a second word line that is different from the first word line.

12. The program method of claim 10, wherein the non-volatile memory device comprises a plurality of memory cells that store the user data, the plurality of memory cells being connected to the first word line.

13. The program method of claim 12, wherein programming the index cell with the index bit comprises:
    supplying a stepwise increased program voltage to the first word line; and
    completing a program operation for the index cell when the program voltage reaches a target voltage.

14. The program method of claim 13, further comprising:
    detecting the initial threshold voltage of the index cell by sensing data of the index cell with a stepwise increased read voltage being supplied to the first word line.

15. A non-volatile memory device comprising:
    a memory cell array comprising a main area and an index area, the main area comprising main memory cells arranged among a plurality of word lines and a plurality of bit lines for storing user data bits, and the index area comprising index memory cells arranged among the plurality of word lines and a plurality of index bit lines, the index memory cells including threshold voltage information cells and an index cell storing an index bit and providing a threshold voltage variation;
    a row decoder for selecting one of the plurality of word lines in response to an address;
    a word line voltage generator for supplying a word line voltage to the selected word line in response to a step code;
    a page buffer for temporarily storing the user data bits to be programmed in or sensed from the main area, temporarily storing the index bit to be programmed in the index area and data bits corresponding to an initial threshold voltage of the index cell, and temporarily storing the index bit and the data bits corresponding to the initial threshold voltage sensed from the index area via the plurality of index bit lines; and
    a controller for controlling the word line voltage generator and the page buffer, and generating the step code applied to the word line voltage generator.

16. The non-volatile memory device of claim 15, wherein the page buffer comprises:
    a main page buffer for temporarily storing the user data bits sensed from or to be programmed in the main area; and
    an index page buffer for temporarily storing the data bits sensed from or to be programmed in the index area.

17. The non-volatile memory device of claim 16, wherein during a program operation, the controller controls the index page buffer to program the index bit in the index cell, to read an initial threshold voltage of the index cell, and to program data corresponding to the initial threshold voltage in the threshold voltage information cells,
    the index cell and the threshold voltage information cells being connected to a word line that is connected to memory cells in which the user data is to be programmed.

18. The non-volatile memory device of claim 17, wherein during a read operation, the controller controls the index page buffer and the word line voltage generator to read data corresponding to the initial threshold voltage from the threshold voltage information cells and a current threshold voltage from the index cell,
    the controller detecting a shifted threshold voltage level by comparing the initial threshold voltage and the current threshold voltage, and varying a read voltage by the shifted threshold voltage level.

19. The non-volatile memory device of claim 15, wherein the non-volatile memory device is a NAND flash memory device.

20. A memory system comprising:
a non-volatile memory device; and
a memory controller for controlling the non-volatile memory device,
wherein the non-volatile memory device comprises a non-volatile memory device claimed in claim 15.

21. The memory system of claim 20, wherein the memory system determines whether to perform a compensating read operation during a read operation, a read voltage being varied according to a threshold voltage variation while the compensating read operation is carried out.

22. The memory system of claim 21, wherein the memory controller comprises an error detector for detecting an error of user data,
wherein when the number of detected erroneous bits exceeds a given number, the compensating read operation is carried out.

* * * * *